United States Patent
Lee (10) Patent No.: US 11,728,421 B2
(45) Date of Patent: Aug. 15, 2023

(54) SPLIT TRENCH GATE SUPER JUNCTION POWER DEVICE

(71) Applicant: SEMICONDUCTOR COMPONENTS INDUSTRIES, LLC, Phoenix, AZ (US)

(72) Inventor: Wonhwa Lee, Bucheon-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/802,718

(22) Filed: Feb. 27, 2020

(65) Prior Publication Data

US 2021/0273091 A1    Sep. 2, 2021

(51) Int. Cl.
*H01L 29/78* (2006.01)
*H01L 29/06* (2006.01)
*H01L 29/66* (2006.01)
*H01L 29/423* (2006.01)

(52) U.S. Cl.
CPC ...... *H01L 29/7813* (2013.01); *H01L 29/0634* (2013.01); *H01L 29/0696* (2013.01); *H01L 29/4236* (2013.01); *H01L 29/66734* (2013.01)

(58) Field of Classification Search
CPC ............. H01L 29/7813; H01L 29/0634; H01L 29/0696; H01L 29/4236; H01L 29/66734
See application file for complete search history.

(56) References Cited

U.S. PATENT DOCUMENTS

| | | | |
|---|---|---|---|
| 8,106,447 B2 * | 1/2012 | Hozumi | H01L 29/66734 257/331 |
| 9,023,692 B2 * | 5/2015 | Yoshida | H01L 29/861 257/172 |
| 9,443,974 B2 | 9/2016 | Gao et al. | |
| 2006/0216896 A1 * | 9/2006 | Saito | H01L 24/05 438/270 |
| 2009/0008709 A1 | 1/2009 | Yedinak et al. | |
| 2010/0065903 A1 * | 3/2010 | Parthasarathy | H01L 29/7802 257/329 |
| 2016/0118492 A1 * | 4/2016 | Asada | H01L 29/0865 257/334 |
| 2017/0194485 A1 * | 7/2017 | Smith | H01L 29/7813 |

* cited by examiner

*Primary Examiner* — Dale E Page
*Assistant Examiner* — Quovaunda Jefferson
(74) *Attorney, Agent, or Firm* — Brake Hughes Bellermann LLP (57) ABSTRACT

A power semiconductor device includes a semiconductor layer having a first conductivity type. A pillar is provided in the semiconductor layer and has a second conductivity type that is different than the first conductivity type. A first trench gate is provided in the pillar proximate to a first vertical edge of the pillar. A second trench gate is provided in the pillar proximate to a second vertical edge of the pillar, the second vertical edge being on an opposing side of the pillar of the first vertical edge. A first electrode is provided over a first side of the semiconductor layer. A second electrode is provided over a second side of the semiconductor layer.

19 Claims, 6 Drawing Sheets

SPLIT TRENCH GATE SUPER JUNCTION POWER DEVICE

BACKGROUND

The present disclosure relates to a power semiconductor device, in particular to a power device having a super junction structure.

Power devices based on super junction technology have gained wide acceptance recently. The super junction (SJ) power devices offer lower on-resistance with reduced gate and output charges, thereby enabling more efficient switching.

SJ power devices typically have a plurality of pillars in the drift region where the pillars (e.g., P-pillars) provide charge balanced areas with respect to the surrounding regions (e.g., N regions) under reverse bias. As a result, the drift region can be thinner and doped with a higher concentration since the combined structure offers a higher resistance to applied reverse voltage. Accordingly, SJ power devices provide lower on-resistance (or specific resistance) than conventional MOSFETs.

SJ power devices may be used in many different industries. Some of these industries, such as telecommunications, electrical vehicles, computing and charging systems, are rapidly developing. These industries would benefit from improved device characteristics, including improved ruggedness, lower on-resistance, body diode dv/dt immunity during switching to reverse voltage, faster switching speed, and miniaturization.

SUMMARY

Embodiments of the present application relate to a power semiconductor device (e.g., MOSFET, IGBT, or the like) having super junction (SJ) pillars and trench gates. In an embodiment, the SJ power device is configured for high voltage application (500 V or more) and has relatively low specific on-resistance (or Rsp). In an embodiment, the SJ power device has split trench gates in a pillar and a trench gate in a drift region, thereby providing different current paths for forward current and reverse recovery current.

In an embodiment, a power semiconductor device includes a semiconductor layer having a first conductivity type. A pillar is provided in the semiconductor layer and has a second conductivity type that is different than the first conductivity type. A first trench gate is provided in the pillar proximate to a first vertical edge of the pillar. A second trench gate is provided in the pillar proximate to a second vertical edge of the pillar, the second vertical edge being on an opposing side of the pillar of the first vertical edge. A first electrode is provided over a first side of the semiconductor layer. A second electrode is provided over a second side of the semiconductor layer.

In an embodiment, the power semiconductor device includes a third trench gate provided in the semiconductor layer and spaced apart from the pillar, the third trench gate having a first vertical surface and a second vertical surface. The first and second trench gates are separated by a shielding portion of the pillar.

In an embodiment, the first, second, and third trench gates define first, second, third, and fourth channels, respectively. The first trench gate defines a first channel proximate to the first vertical edge of the pillar. The second trench gate defines a second channel proximate to the second vertical edge of the pillar. The third trench gate defines the third channel proximate to the first vertical surface of the third trench gate and the fourth channel proximate to the second vertical surface of the third trench gate.

In an embodiment, the power semiconductor device further includes a well of the second conductivity provided proximate to the first electrode. A plurality of heavily doped regions of the second conductivity is provided in the well. The heavily doped regions include first, second, third and fourth regions that make first, second, third, and fourth Ohmic contacts with the first electrode, respectively.

In an embodiment, the first region is proximate to the first vertical edge of the pillar. The second region is provided in the pillar and between the first and second trench gates. The third region is provided between the second and third trench gates. The fourth region is provided proximate the second vertical surface of the third trench gate.

In an embodiment, the first, third, and fourth regions define current paths for a forward current of the power device, and the second region defines a current path for a reverse recovery current of the power device.

In an embodiment, the power semiconductor device further includes a plurality of wells of the second conductivity provided proximate to the first electrode and a plurality of heavily doped regions of the first conductivity type. A plurality of heavily doped regions of the second conductivity type is provided in the wells. The heavily doped regions include first, second, and third regions that make first, second, and third Ohmic contacts with the first electrode, respectively.

In an embodiment, the first region is proximate to the first vertical edge of the pillar. The second region is provided in the pillar and between the first and second trench gates. The third region is proximate to the second vertical edge of the pillar.

In an embodiment, the first and third regions define current paths for a forward current, and the second region defines a current path for a reverse recovery current.

In an embodiment, the first trench gate defines a first channel proximate to the first vertical edge of the pillar, and the second trench gate defines a second channel proximate to the second vertical edge of the pillar.

In an embodiment, the first trench gate includes a gate electrode and a gate dielectric material. The first gate dielectric material includes a gate dielectric layer and a gate dielectric spacer. The gate dielectric layer is provided over the first channel and has a thickness of no more than 0.15 um. The gate dielectric spacer has a thickness of at least 0.2 um.

In an embodiment, the gate dielectric material is an oxide and encapsulates the gate electrode.

In an embodiment, the first trench gate includes a gate electrode and a gate oxide material encapsulating the gate electrode. The first trench gate includes first, second, third, and fourth sides. The first side corresponds to the first vertical edge of the pillar and defines the first channel of the first trench gate. The second side corresponds to an upper surface of the first trench gate. The third side corresponds to an opposing side of the first side. The fourth side corresponds to a bottom surface of the first trench gate. The gate oxide material has first, second, third, and fourth thicknesses at the first, second, third, and fourth sides of the first gate trench, respectively. The first thickness is no more than 0.15 um. The second, third, and fourth thicknesses are at least 0.20 um.

In an embodiment, the power device is a MOSFET, and the pillar provides a charge balance area. The first conductivity type is an N conductivity type, and the second conductivity type is a P conductivity type.

In an embodiment, the power device is configured to handle a breakdown voltage of at least 600V and has an on-resistance of no more than 10 mOhm/cm².

In another embodiment, a power semiconductor device includes a plurality of unit cells. Each unit cell has a first trench gate provided in a first pillar, the first trench gate having a first side proximate to a vertical edge of the first pillar and a second side facing an interior of the first pillar. A second trench gate is provided in a second pillar, the second trench gate having a first side proximate to a vertical edge of the second pillar and a second side facing an interior of the second pillar. The first and second pillars are adjacent pillars. A third trench gate is provided between the first and second trench gates, the third trench gate extending into a drift region. First, second, third, and fourth heavily doped regions make Ohmic contacts with an electrode. The first heavily doped region is provided in the first pillar. The second heavily doped region is provided between the first and third trench gates. The third heavily doped region is provided between the second and third trench gates. The fourth heavily doped region is provided within the second pillar.

In an embodiment, the second and third heavily doped regions provide current paths for a forward current, and the first and fourth heavily doped regions provide current paths for a reverse recovery current.

In yet another embodiment, a method for forming a power semiconductor device includes providing an epi layer over a substrate. A pillar and a well are formed in the epi layer. The pillar and the epi layer are etched to form first, second, and third trenches, the first and second trenches being provided in the pillar. The third trench is provided the epi layer spaced apart from the pillar. First, second and third trench gates are formed in the first, second, and third trenches, respectively. First, second, third, and fourth heavily doped regions are formed, the second heavily doped region being provided within the pillar and between the first and second trench gates. A first metal electrode is provided over a first side of the epi layer and make Ohmic contacts with the first, second, third, and fourth heavily doped regions. A second metal electrode is provided over a second side of the epi layer.

In an embodiment, the first, third, and fourth heavily doped regions provide current paths for a forward current of the power device, and the second heavily doped region provides a current path for a reverse recovery current of the power device.

In an embodiment, the first trench gate includes first, second, third, and fourth sides, the first trench gate having a gate electrode and a gate oxide material encapsulating the gate electrode. The gate oxide material has first, second, third, and fourth thicknesses at the first, second, third, and fourth sides of the first gate trench, respectively. The first side defines a channel for the first trench gate. The second side corresponds to an upper surface of the first trench gate. The third side corresponds to an opposing side of the first side. The fourth side corresponds to a bottom surface of the first trench gate. The first thickness is no more than 0.15 um. The second, third, and fourth thicknesses are at least 0.20 um.

DETAILED DESCRIPTION

Embodiments of the present application relate to a power semiconductor device having super junction (SJ) pillars and trench gates. The SJ power device may be a MOSFET, IGBT, or the like. In an embodiment, the SJ power device has split trench gates in a pillar and a trench gate in a drift region, thereby providing different current paths for forward current and reverse recovery current.

In an embodiment, the SJ power device is a MOSFET configured for high voltage application (500 V or more) and has relatively low specific on-resistance (or Rsp). In an embodiment, the power device is configured to handle a breakdown voltage of 600 V or greater and has an on-resistance of 10 mOhm/cm² or less.

In an embodiment, the SJ power device lowers the on-resistance by providing an increased number of current paths for forward current. The two split trench gates in a pillar and a trench gate in a drift region together provide at least four gate channels. Additionally, the SJ power device improves the device ruggedness, particularly body diode dv/dt immunity during switching, by providing a current path through the pillar for avalanche or reverse recovery current. In an embodiment, the trench gates are provided with an oxide that is 0.2 um or greater to increase the breakdown voltage and reduce the gate-source capacitance.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1:
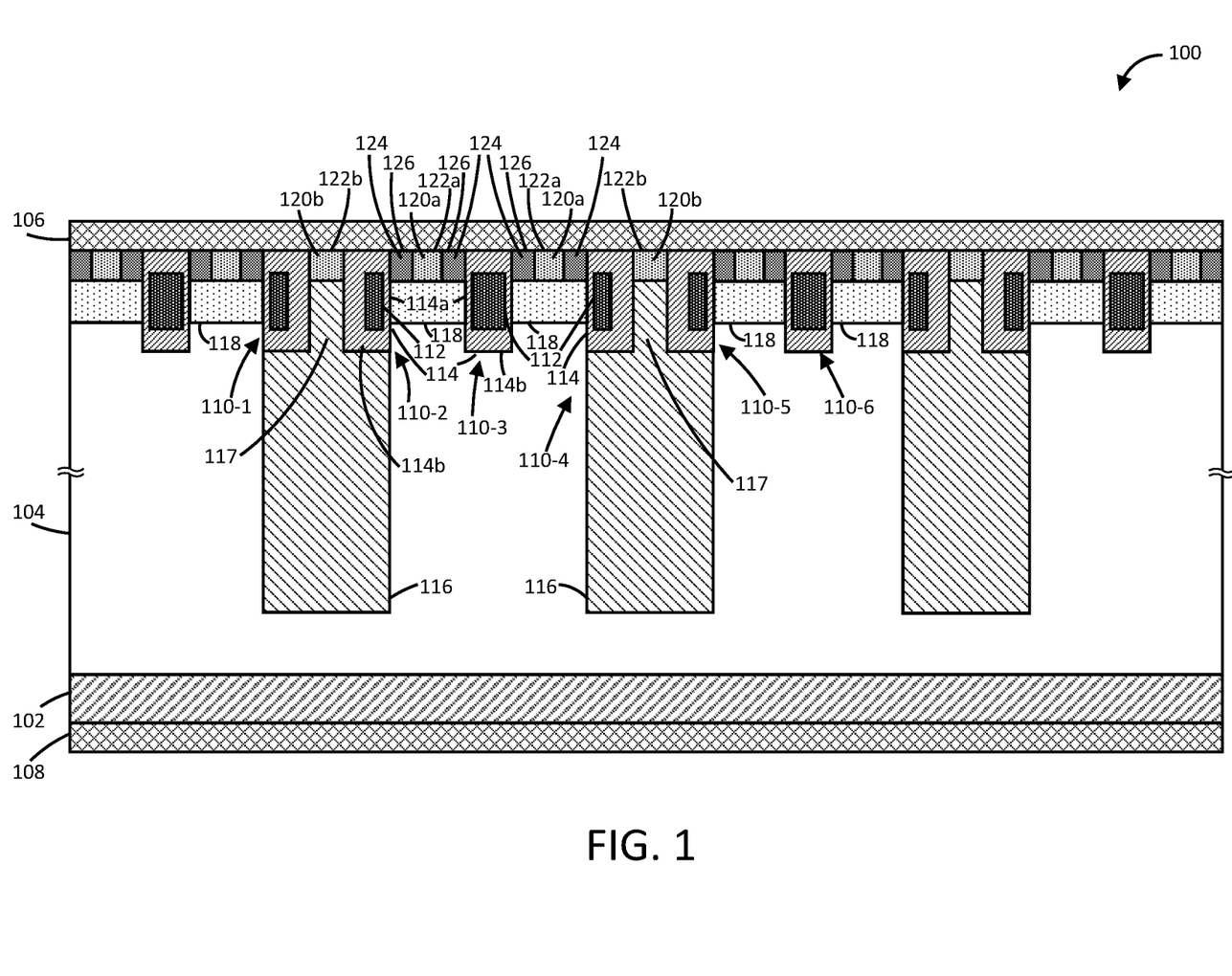
FIG. 1 illustrates a power semiconductor device having super junction pillars according to an embodiment.

FIG. 1 illustrates a power semiconductor device 100 having super junction pillars according to an embodiment of the present disclosure. In an embodiment, the power device 100 is a power metal oxide semiconductor field effect transistor (MOSFET) device. In other embodiment, the power device 100 is an insulated gate bipolar transistor (IGBT) device. If the power device 100 is an IGBT, it would have an additional P+ substrate or layer, as would be understood by one skilled in the art.

The power device 100 includes a semiconductor substrate 102. In an embodiment, the substrate 102 is a silicon substrate, but it may be other types (e.g., silicon carbide) of substrates depending on implementation. An epitaxial layer 104 (or epi layer) is provided on a first side of the substrate 102. The epi layer is lightly doped and may be referred to as a drift region. A first electrode 106 is provided over the epi layer 104. A second electrode 108 is provided on or over a second side of the substrate 102.

In the present embodiment, the power device 100 is a power MOSFET and the first and second electrodes 106 and 108 are source and drain electrodes, respectively. In another embodiment, the power device may be an IGBT and the first and second electrodes 106 and 108 may be emitter and collector electrodes, respectively.

In an embodiment, the epi layer 104 has N type conductivity. The epi layer 104 is lightly doped to prevent current flow between the source and drain electrodes 106 and 108 when the power device is turned off. Since forward current flows through the epi layer 104 when the power device 100 is turned on, the conductivity of the epi layer 104 has an important impact on the on-resistance of the power device.

A plurality of gate structures 110 (e.g., 110-1, 110-2, 110-3, 110-4, 110-5, 110-6, etc.) are used to turn on the power device. The gate structures (or gates) 110 are trench gates and are provided proximate the source electrode 106 (or on the frontside) of the power device 100. Each trench gate 110 includes a gate electrode 112 and a dielectric material (e.g., oxide) 114. In an embodiment, the dielectric material 114 encloses or encapsulates the gate electrode 112 in the trench. The oxide material 114 includes a first portion 114a that overlies a portion of the gate electrode that defines a channel and a second portion 114b that overlies other parts of the gate electrode 112.

In an embodiment, the trench gate 110 includes first, second, third, and fourth sides, where the first side corresponds to a vertical edge that defines the channel, the second side corresponds to an upper surface of the trench gate, the third side corresponds to an opposing side of the first side, and the fourth side corresponds to a bottom surface of the trench gate. The thickness of the oxide material 114 at the first side is no more than 0.15 um to provide desired gate characteristics. However, the thicknesses of the oxide material 114 at the second, third, and fourth sides are substantially thicker (e.g., 0.2 um or greater) to provide a higher breakdown voltage and reduce the capacitance between the gate and source.

For illustrative convenience, a portion of the gate oxide material 114 at the first side is referred to as the first portion 114a, and portions of the gate oxide material 114 at the second, third, and fourth sides are referred to the second portion 114b. Alternatively, the first portion 114a and the second portion 114b may be referred to as a gate oxide layer and a gate spacer, respectively.

In an embodiment, the second portion 114b is substantially thicker than the first portion 114a. For example, the first portion 114a may have a thickness of 0.06 to 0.15 um, and the second portion 114b may have thickness of 0.2 um or greater. The thickness of the second portion 114b may be adjusted to according to the desired breakdown voltage and the gate-source capacitance since increasing its thickness tends to increase the breakdown voltage and reduce the gate-source capacitance. In an embodiment, the second portion 114b at the second side has a thickness (or top thickness) of 0.2 um, 0.3 um, 4 um, or greater. In an embodiment, the second portion 114b at the fourth side has a thickness (or bottom thickness) of 0.2 um, 0.3 um, 4 um, or greater according to implementation.

A plurality of pillars 116 is provided within the epi layer 104. In an embodiment, the pillars 116 have P type conductivity. The pillars 116 serve as charge balancing areas with respect to the epi layer 104 under reverse bias, thereby allowing the epi layer to be doped with a higher dopant concentration without significantly lowering the breakdown voltage of the power device 100. Increasing the dopant concentration of the epi layer 104 lowers the on-resistance of the power device 100.

In an embodiment, the pillars 116 have a dopant concentration of about $10^{16}$ atoms/cm$^3$. The pillar 116 may have a vertical dimension of 20 microns or more depending on implementation. For example, for a 600-650 V device, the pillars have a vertical dimension of about 45-50 microns according to an implementation.

A plurality of wells 118 is provided in the epi layer 104. The depth of the wells 118 may depend on the characteristics of the power device 100. In an embodiment, the depth of the wells range between about 1 micron to about 5 microns. In an embodiment, the wells 118 have P type conductivity and form a body diode with the epi layer 104. The dopant concentration of the P wells 118 is about $1\times10^{16}$ atoms/cm$^3$ to about $1\times10^{17}$ atoms/cm$^3$.

A plurality of trench gate structures 110 (e.g., 110-1 and 110-2) are formed in the pillars 116. In an embodiment, at least two gate structures (or gates) 110 are formed in each pillar 116 and separated by a shielding portion 117 of the pillar 116. These gates separated by the shielding portion 117 may be referred to as split gates (e.g., gates 110-1 and 110-2). The shielding portion 117 is provided with sufficient thickness to shield the split gates from interfering with each other's operation. In an embodiment, the portion 117 has a thickness of 0.5 um to 2.5 um.

The split gates 110-1 and 110-2 border the epi layer 104 on opposing sides of the pillar 116. Each split gate provides a channel at the border between the pillar 116 and the epi layer 104 for forward current when the power device 100 is turned on. The shielding portion 117 of the pillar, on the other hand, provides a different current path for avalanche or reverse recovery current, which improves the body diode dv/dt immunity during reverse switching.

In addition to the split gates, a plurality of trench gates 110 (e.g., gates 110-3 and 110-6) are formed between the pillars in the P-wells 118. In an embodiment, the trench gate 110-3 provides at least two channels on opposing sides of the trench gate (e.g., a first channel at a first vertical surface and a second channel at a second vertical surface of the trench gate 110-3) for forward current when the power device 100 is turned on. In other words, as will be further explained below, each unit cell of the power device is provided with at least four channels for forward current. The increased number of channels or current paths helps reduce the on-resistance of the power device 100. In an embodiment, the power device 100 is a MOSFET that has a breakdown voltage of at least 600V and an on-resistance of no more than 10 mOhm/cm$^2$.

A plurality of heavily doped regions 120 (e.g., 120a and 120b) are provided in the pillars 116 and the P-wells 118. In an embodiment, the heavily doped regions 120 have P type conductivity and are referred to as P+ regions. The P+ regions 120 form Ohmic contacts with the source electrode 106 at source areas 122a and 122b. In an embodiment, the P+ regions 120 have a dopant concentration of about $1\times10^{18}$ atoms/cm$^3$ to about $1\times10^{20}$ atoms/cm$^3$.

A plurality of heavily doped regions 124 are provided within the P-wells 118 adjacent to the trench gates 110. In an embodiment, the heavily doped regions 124 have N type conductivity and are referred to as N+ regions. The N+ regions form Ohmic contacts with the source electrode 106 at source areas 126. In an embodiment, the N+ regions 124 have a dopant concentration of about $1\times10^{19}$ atoms/cm$^3$ to about $1\times10^{21}$ atoms/cm$^3$.

The P+ regions 120 includes a first type 120a and a second type 120b that define two different current paths. The P+ region of the first type 120a is provided between the N+ regions 124 and is proximate to a vertical edge of the pillar 116. The P+ region of the first type 120a provides an electrical connection between the source electrode 106 and the P-well 118, thereby defining a current path for the forward current when the gates 110 are turned on.

The P+ region of the second type 120b is provided between the split trench gates 110 (e.g., 110-1 and 110-2). The second type 120b provides an electrical connection between the source electrode 106 and the pillar 116, thereby defining a current path for the avalanche or reverse recovery current that uses a different path than the forward current. The current path provided through the pillar 116 reduces the parasitic NPN transistor turn-on that might result from the avalanche current of the power device 110 after avalanche breakdown phenomenon and body diode reverse recovery current compared with DMOS structured super junction MOSFET, thereby improving the ruggedness of the power device 110 and enhancing body diode dv/dt immunity.

FIGS. 2-9 illustrate aspects of a method for forming a semiconductor power device 200 in accordance with an embodiment of this disclosure.

Figure 2:
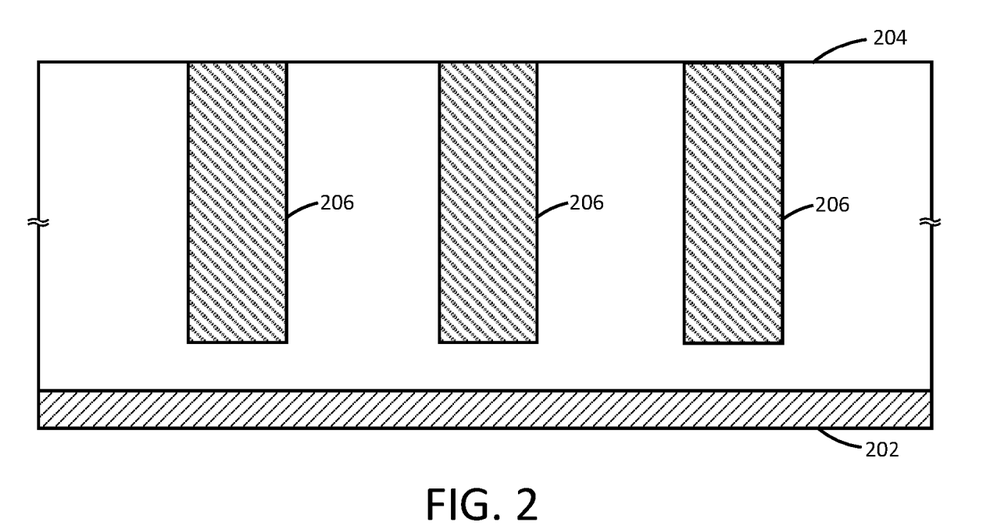
FIGS. 2-9 illustrate a method for forming a power semiconductor device having super junction pillars according to an embodiment.

In FIG. 2, a semiconductor layer 204 is formed over a semiconductor substrate 202. The layer 204 may be formed by an epitaxial growth process. In an embodiment, the substrate 202 is silicon, and each epitaxial growth step forms an epi layer having about 2.5 to 3.2 microns. In other embodiment, the substrate 202 may be other semiconductor materials, such as a group IV semiconductor substrate, a group III-V compound semiconductor substrate, or a group II-VI oxide semiconductor substrate. For example, the group IV semiconductor substrate may include a silicon substrate, a germanium substrate, a silicon-germanium substrate, or silicon carbide substrate.

In an embodiment, the substrate 202 may be an N+ doped layer where the power device is a MOSFET. In another embodiment, the substrate 202 may be a P+ layer where the power device is an IGBT. The layer 204 may be made by growing a plurality of epi layers and implanting the N type impurities to convert the layer 204 to N type conductivity. The layer 204 is light doped with N type impurities to a dopant concentration of below $1\times10^{15}$ atoms/cm$^3$. Annealing may be performed to facilitate the diffusion of the impurities. The layer 204 including a plurality of pillars 206 of P type conductivity. The pillars 206 may be formed by selectively implanting P type impurities (or ions) as each epi layer is formed over the substrate 202 to obtain the layer 204. The P type impurities are provided with sufficient concentration to convert the lightly doped epi layer. In an embodiment, the pillars 206 has a dopant concentration of about $1\times10^{16}$ atoms/cm$^3$ to about $1\times10^{17}$ atoms/cm$^3$. The total depth (or vertical dimension) of the pillar 206 from top to base may be greater than 20 microns, e.g., in the range of about 30 to 60 microns.

Figure 3:
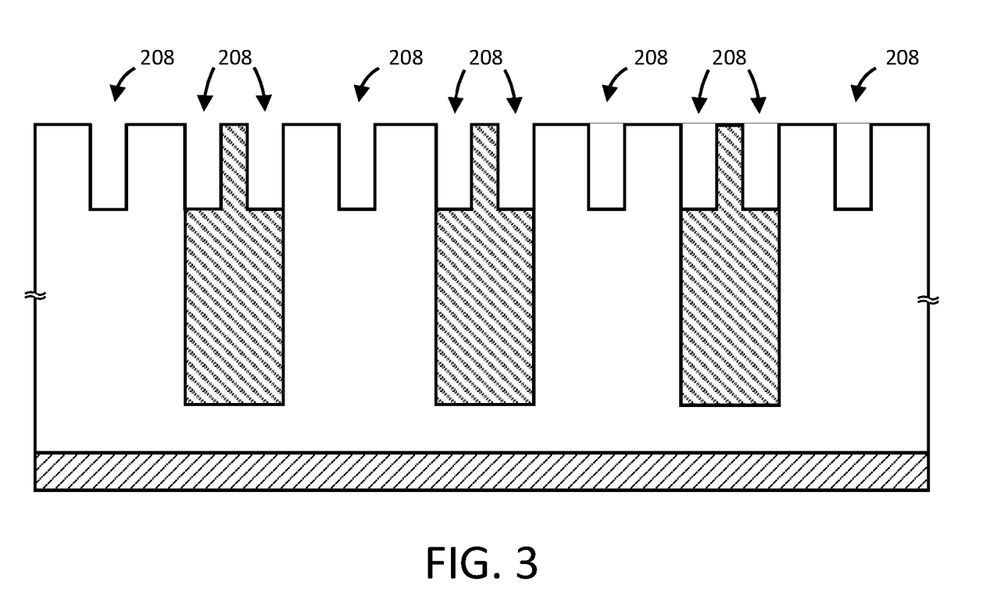
Figure 4:
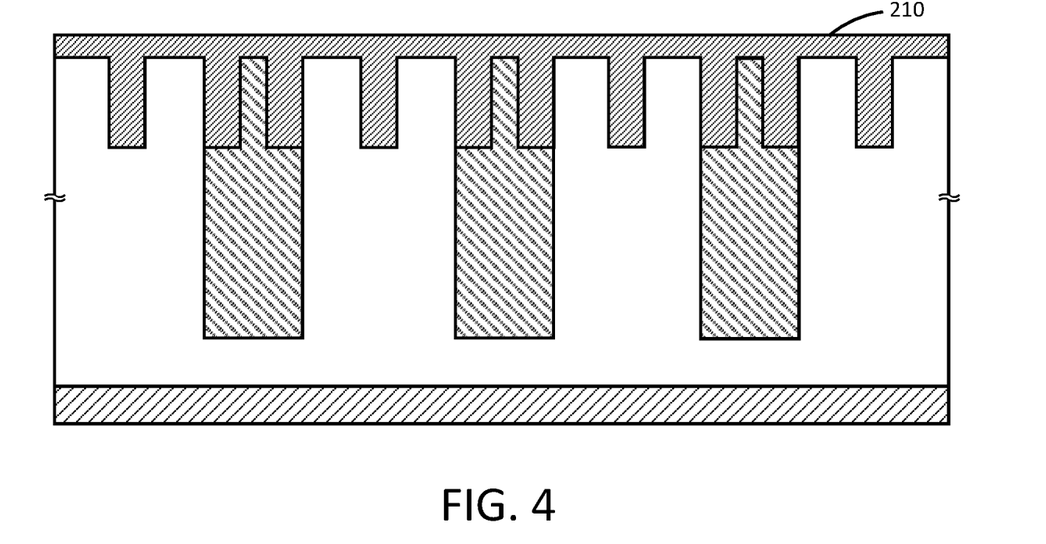
Figure 5:
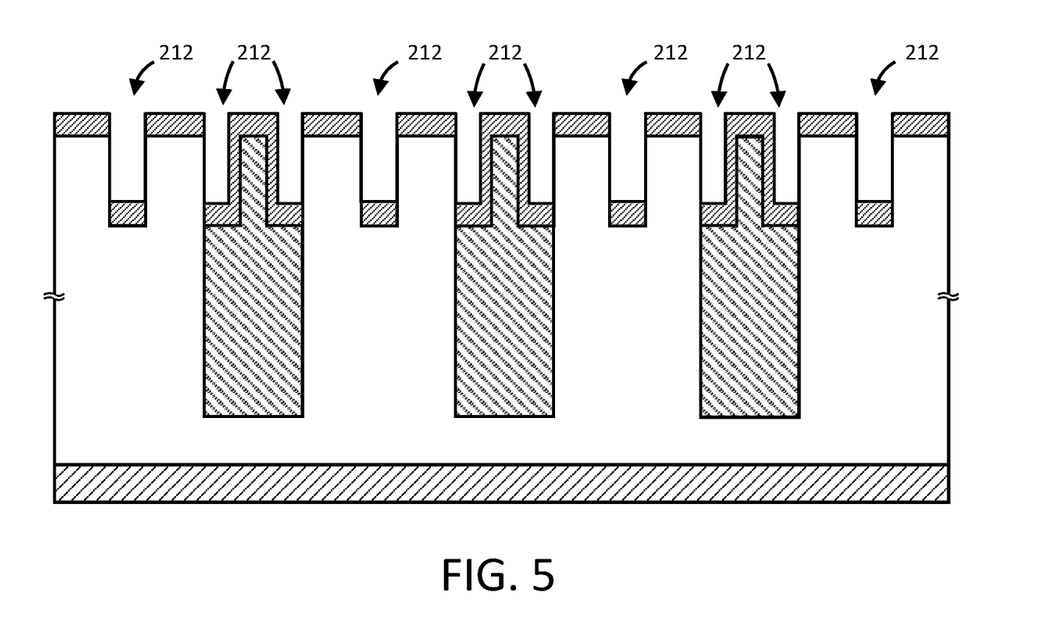

Referring to FIG. 3, a photoresist layer (not shown) is formed over the layer 204 and patterned to expose selected areas of the layer 204. The exposed areas are etched to form a plurality of trenches 208. A first insulation layer 210 is formed over the layer 204 and the trenches 208 (FIG. 4). In an embodiment, the first insulation layer is an oxide layer. In another embodiment, the first insulation layer is a nitride layer. A photoresist layer (not shown) is formed over the first insulation layer 210 and patterned to expose selected areas of the first insulation layer. The first insulation layer 210 is etched to form a plurality of gate trenches 212 (FIG. 5).

Figure 6:
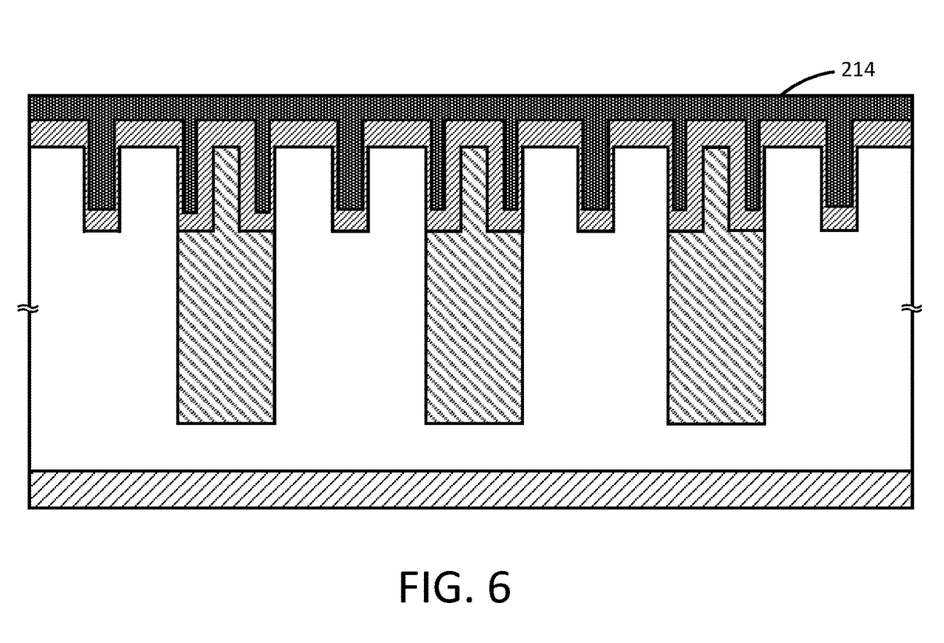
Figure 7:
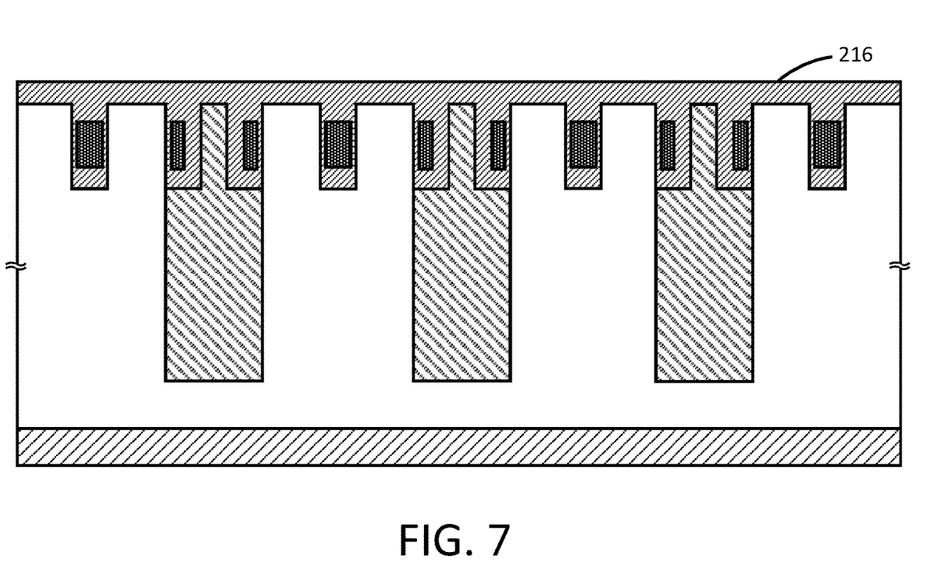

A conductive material (e.g., doped polysilicon) 214 is formed over the first insulation layer 210 and provided within the gate trenches 212 (FIG. 6). The conductive material is used to form the gate electrodes in the gate trenches 212. The conductive material 214 is etched, so that it remains only within the gate trenches 212 (FIG. 7). A second insulation layer 216 formed over the etched conductive material 214. In an embodiment, the second insulation layer 216 is the same material as the first insulation layer 210, where both are oxide layers. The second insulation layer (or oxide layer) 216 may be formed using a thermal oxidation process to provide better gate characteristics.

Figure 8:
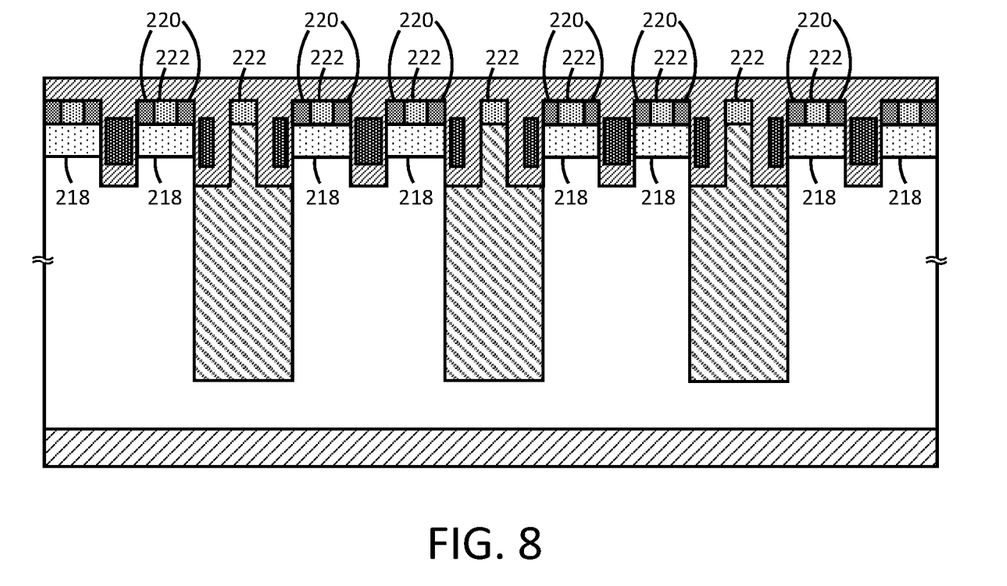

Referring to FIG. 8, a first mask layer (not shown) is formed over the second insulation layer 216 and patterned. In an embodiment, the mask layer is a photoresist layer. P type dopants are implanted into the portions of the second insulation layer 216 that are exposed by the patterned first mask layer. A plurality of P wells 218 is formed. In an embodiment, the P wells 218 have a dopant concentration of about $1\times10^{16}$ atoms/cm$^3$ to about $1\times10^{17}$ atoms/cm$^3$. Annealing may be performed to facilitate the diffusion of the dopants. The first mask layer is removed, and a second mask layer (not shown) is formed over the second insulation layer 216. The second mask layer is pattern to expose selected portions of the second insulation layer 216. N type dopants are implanted into the exposed portions of the second insulation layer 216 and form a plurality of N+ regions 220 at the upper part of the P wells 218. In an embodiment, the N+ regions 220 have a dopant concentration of about $1\times10^{19}$ atoms/cm$^3$ to about $1\times10^{21}$ atoms/cm$^3$.

After removing the second mask layer, a third mask layer (not shown) is formed over the second insulation 216 and patterned to expose selected portions of the second insulation layer 216. P type dopants are implanted into the exposed portions of the second insulation layer 216. A plurality of P+ regions 222 is formed. In an embodiment, the P+ regions 222 have a dopant concentration of about $1\times10^{18}$ atoms/cm$^3$ to about $1\times10^{20}$ atoms/cm$^3$. Depending on implementation, the order of formation may be reversed, so that the P+ regions 222 are formed before the N+ regions 220.

Figure 9:
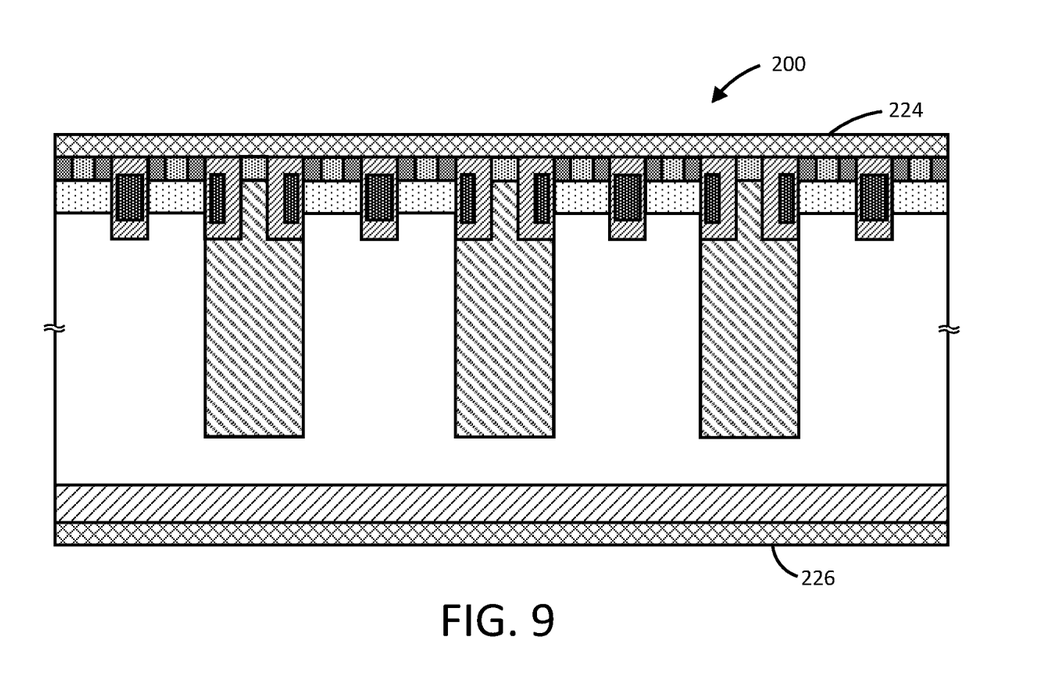

Referring to FIG. 9, the second insulation layer 216 is removed to expose the upper surfaces of the N+ regions 220 and P+ regions 222. In an embodiment, the second insulation layer is 216 is etched and polished to planarize the surface, making the upper surfaces of the second insulation layer 216, the N+ regions 222 and the P+ regions substantially planar. Thereafter, a first metal layer 224 is formed over the planarized surfaces (or the front side) of the substrate 202. A second metal layer 226 is formed over the opposing side (or the back side) of the substrate 202.

A resulting device is a power semiconductor device 200 that corresponds to the super junction power device 100 in FIG. 1. In an embodiment, the power device 200 is a power MOSFET, the first metal layer 224 is a source electrode, and the second metal layer is a drain electrode. In other embodiment, the power device 200 may be an IGBT, or the like.

Figure 10:
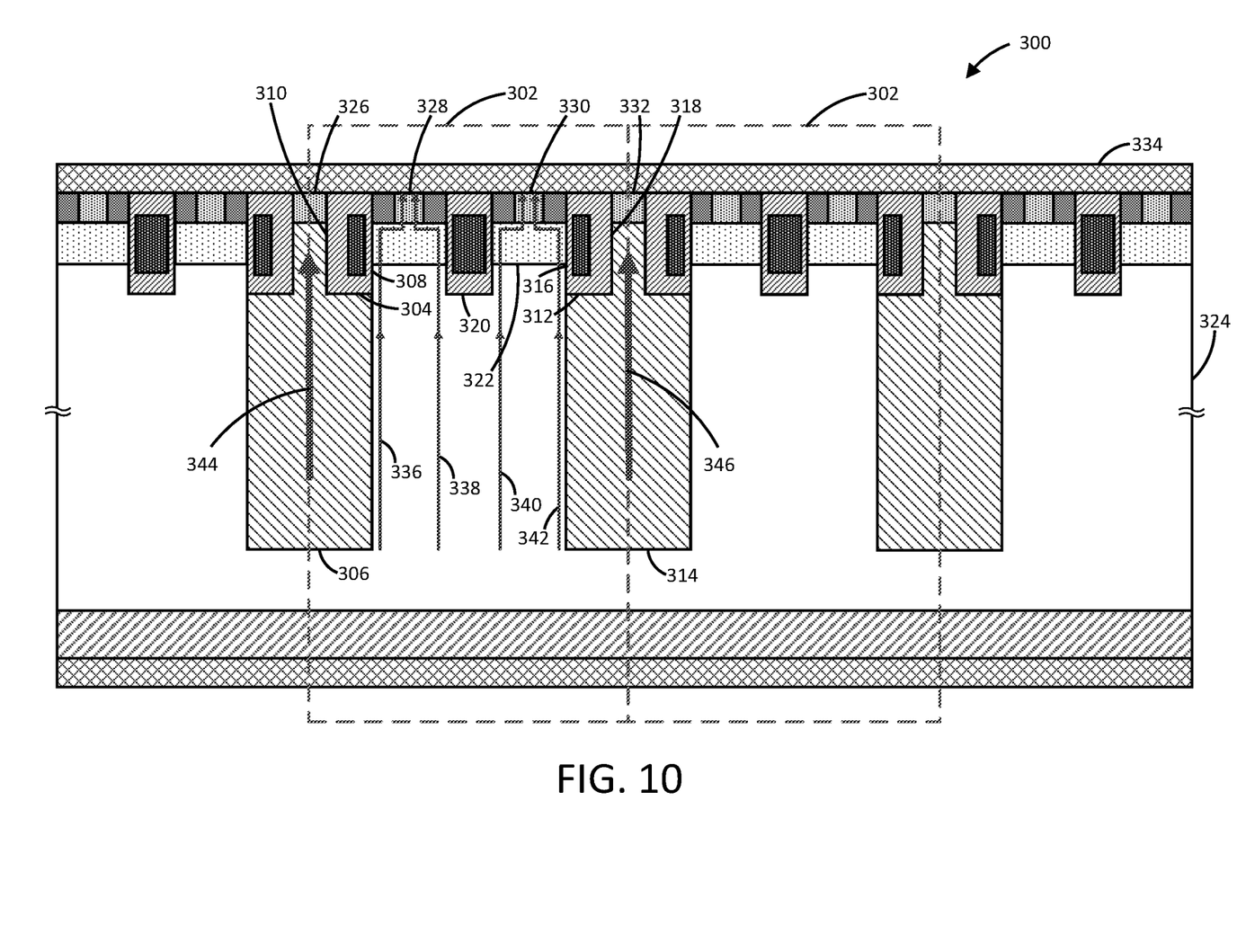
FIG. 10 illustrates a power MOSFET having super junction pillars with unit cells according to an embodiment.

FIG. 10 illustrates a super junction MOSFET 300 having a plurality of unit cells 302 according to an embodiment. Each unit cell 302 includes a first trench gate 304 provided in a first pillar 306. The first trench gate has a first side 308 proximate to a vertical edge of the first pillar and a second side 310 facing an interior of the first pillar 306. A second trench gate 312 is provided in a second pillar 314. The second trench gate has a first side 316 proximate to a vertical edge of the second pillar and a second side 318 facing an interior of the second pillar. The first pillar 306 and the second pillar 314 are adjacent pillars. A third trench gate 320 is provided between the first and second trench gates 304 and 312 and extends to a drift region 324 through a P-well 322.

First, second, third, and fourth P+ regions 326, 328, 330, and 332 are formed on the upper part of the P-well 322 and make Ohmic contacts with a source electrode 334. The first P+ region 326 is provided in the first pillar. The second P+ region 328 is provided between the first and third trench gates, and the third P+ region 330 is provided between the second and third trench gates. The fourth P+ 332 is provided within the second pillar.

The second and third P+ regions electrically couple the P-well 322 to the source electrode 334 and provide current paths for forward current. For example, the unit cell 302 provides first, second, third, and fourth current paths 336, 338, 340, and 342 when the MOSFET 300 is turned on.

The first and fourth P+ regions electrically couple the first and second pillars 306 and 314 to the source electrode 334 and provide different current paths for avalanche or reverse recovery current, i.e., through the pillars. For example, the unit cell 302 provides fifth and sixth current paths 344 and 346 for the reverse recovery current when the MOSFET 300 switches from the forward voltage to the reverse voltage, which provides the MOSFET with an enhanced body diode dv/dt immunity.

Aspects of the present disclosure have been described in conjunction with the specific embodiments thereof that are proposed as examples. Numerous alternatives, modifications, and variations to the embodiments as set forth herein may be made without departing from the scope of the claims set forth below. For example, the SJ power device of the present invention may be used in a low or medium voltage applications in addition to high voltage applications. Accordingly, embodiments as set forth herein are intended to be illustrative and not limiting.

What is claimed is:

1. A power semiconductor device, comprising:
a semiconductor layer having a first conductivity type;
a pillar provided in the semiconductor layer and having a second conductivity type that is different than the first conductivity type;
a first trench gate provided in the pillar proximate to a first vertical edge of the pillar, the first trench gate bordering a first portion of the semiconductor layer to define a first channel aligned with the first vertical edge of the pillar;
a second trench gate provided in the pillar proximate to a second vertical edge of the pillar, the second vertical edge being on an opposing side of the pillar of the first vertical edge, and the second trench gate bordering a second portion of the semiconductor layer to define a second channel aligned with the second vertical edge of the pillar;
a first electrode provided over a first side of the semiconductor layer;
a second electrode provided over a second side of the semiconductor layer; and
a region of the second conductivity type provided in the pillar and between the first trench gate and the second trench gate, the region of the second conductivity type electrically coupling the pillar to the first electrode, the region of the second conductivity type being in contact with at least one of the first trench gate or the second trench gate,
wherein the first and second trench gates are separated by a shielding portion of the pillar, the shielding portion of the pillar and the region of the second conductivity type defining a current path for a reverse recovery current of the power semiconductor device.

2. The power semiconductor device of claim 1, further comprising:
a third trench gate provided in the semiconductor layer and spaced apart from the pillar, the third trench gate having a first vertical surface and a second vertical surface.

3. The power semiconductor device of claim 2, wherein the third trench gate defines a third channel and a fourth channel, respectively, and
wherein the third trench gate defines the third channel proximate to the first vertical surface of the third trench gate and the fourth channel proximate to the second vertical surface of the third trench gate.

4. The power semiconductor device of claim 3, wherein the region of the second conductivity type is a first region, the power semiconductor device further comprising:
a well of the second conductivity type provided proximate to the first electrode; and
a plurality of regions of the second conductivity type provided in the well, the plurality of regions including the first region, a second region, a third region, and a fourth region that make first, second, and third, and fourth Ohmic contacts with the first electrode, respectively.

5. The power semiconductor device of claim 4, wherein the second region is proximate to the first vertical edge of the pillar, the third region is provided between the second and third trench gates, and the fourth region is provided proximate the second vertical surface of the third trench gate.

6. The power semiconductor device of claim 5, wherein the second, third, and fourth regions define current paths for a forward current of the power semiconductor device.

7. The power semiconductor device of claim 1, wherein the region of the second conductivity type is a first region, the power semiconductor device further comprising:
a plurality of wells of the second conductivity type provided proximate to the first electrode;
a plurality of regions of the first conductivity type; and
a plurality of regions of the second conductivity type provided in the plurality of wells, the plurality of regions of the second conductivity type including the first region, a second region, and a third region that make first, second, and third Ohmic contacts with the first electrode, respectively.

8. The power semiconductor device of claim 7, wherein the second region is proximate to the first vertical edge of the pillar and the third region is proximate to the second vertical edge of the pillar.

9. The power semiconductor device of claim 8, wherein the second and third regions define current paths for a forward current.

10. The power semiconductor device of claim 1, wherein the first trench gate includes a gate electrode and a gate dielectric material, the first gate dielectric material including a gate dielectric layer and a gate dielectric spacer, the gate dielectric layer provided over the first channel and having a thickness of no more than 0.15 um, the gate dielectric spacer having a thickness of at least 0.2 um.

11. The power semiconductor device of claim 10, wherein the gate dielectric material is an oxide and encapsulates the gate electrode.

12. The power semiconductor device of claim 1, wherein the first trench gate includes a gate electrode and a gate oxide material encapsulating the gate electrode, wherein the first trench gate includes first, second, third, and fourth sides, the first side corresponding to the first vertical edge of the pillar and defining the first channel of the first trench gate, the second side corresponding to an upper surface of the first trench gate, the third side corresponding to an opposing side of the first side, and the fourth side corresponding to a bottom surface of the first trench gate, wherein the gate oxide material has first, second, third, and fourth thicknesses at the first, second, third, and fourth sides of the first trench gate, respectively, and wherein the first thickness is no more than 0.15 um and the second, third, and fourth thicknesses are at least 0.20 um.

13. The power semiconductor device of claim 1, wherein the power semiconductor device is a MOSFET and the pillar provides a charge balance area, wherein the first conductivity type is an N conductivity type, and the second conductivity type is a P conductivity type, and wherein the power semiconductor device is configured to handle a breakdown voltage of at least 600V and has an on-resistance of no more than 10 mOhm/cm$^2$.

14. The power semiconductor device of claim 1, wherein the pillar is a first pillar, and the power semiconductor device further comprising:

a second pillar provided in the semiconductor layer and being adjacent to the first pillar; and a third trench gate provided between the first pillar and the second pillar and being spaced apart from the first pillar and the second pillar, the third trench gate including a gate electrode and a gate dielectric material.

15. A power semiconductor device including a plurality of unit cells, each unit cell comprising:

a first trench gate provided in a first pillar, the first trench gate having a first side aligned with a vertical edge of the first pillar and a second side facing an interior of the first pillar;

a second trench gate provided in a second pillar, the second trench gate having a first side aligned with a vertical edge of the second pillar and a second side facing an interior of the second pillar, the first and second pillars being adjacent pillars;

a third trench gate provided between the first and second trench gates, the third trench gate extending into a drift region; and first, second, third, and fourth heavily doped regions making Ohmic contacts with an electrode, the first heavily doped region being provided in the first pillar, the second heavily doped region provided between the first and third trench gates, the third heavily doped region provided between the second and third trench gates, and the fourth heavily doped region provided within the second pillar.

16. The power semiconductor device of claim 15, wherein the second and third heavily doped regions provide current paths for a forward current, and the first and fourth heavily doped regions provide current paths for a reverse recovery current.

17. A method for forming a power semiconductor device, the method comprising:

providing an epi layer over a substrate;

forming a well and a pillar in the epi layer;

etching the pillar and the epi layer to form first, second, and third trenches, the first and second trenches being provided in the pillar, the third trench being provided in the epi layer spaced apart from the pillar;

forming first, second and third trench gates in the first, second, and third trenches, respectively, the first trench gate having a first side aligned with a first vertical edge of the pillar, the second trench gate having a first side aligned with a second vertical edge of the pillar opposite the first vertical edge of the pillar;

forming first, second, third, and fourth heavily doped regions in the well and the pillar, the second heavily doped region being provided within the pillar and between the first and second trench gates;

providing a first metal electrode over a first side of the epi layer and making Ohmic contacts with the first, second, third, and fourth heavily doped regions; and providing a second metal electrode over a second side of the epi layer.

18. The method of claim 17, wherein the first, third, and fourth heavily doped regions provide current paths for a forward current of the power semiconductor device, and the second heavily doped region provides a current path for a reverse recovery current of the power semiconductor device.

19. The method of claim 17, wherein the first trench gate further includes second, third, and fourth sides, the first trench gate having a gate electrode and a gate oxide material encapsulating the gate electrode, wherein the gate oxide material has first, second, third, and fourth thicknesses at the first, second, third, and fourth sides of the first gate trench, respectively, wherein the first side defines a channel for the first trench gate, the second side corresponds to an upper surface of the first trench gate, the third side corresponds to an opposing side of the first side, and the fourth side corresponds to a bottom surface of the first trench gate, wherein the first thickness is no more than 0.15 um, and wherein the second, third, and fourth thicknesses are at least 0.20 um.

* * * * *